United States Patent [19]

Muterspaugh et al.

[11] 4,410,864
[45] Oct. 18, 1983

[54] IMPEDANCE TRANSFORMATION NETWORK FOR A SAW FILTER

[75] Inventors: Max W. Muterspaugh; Gary A. Whitledge, both of Indianapolis, Ind.

[73] Assignee: RCA Corporation, New York, N.Y.

[21] Appl. No.: 285,237

[22] Filed: Jul. 20, 1981

[51] Int. Cl.³ .............................................. H03H 7/38
[52] U.S. Cl. ........................................ 333/32; 358/188; 330/306; 455/307
[58] Field of Search ............................ 333/32, 193, 194; 307/520; 358/160, 188, 905; 455/307

[56] References Cited

U.S. PATENT DOCUMENTS

| | | | |
|---|---|---|---|
| 3,441,865 | 4/1969 | Siwko | 330/21 |
| 3,582,837 | 6/1971 | DeVries | 333/72 |
| 4,253,119 | 2/1981 | Jones | 358/188 |
| 4,271,433 | 6/1981 | Theriault | 358/191.1 |
| 4,297,660 | 10/1981 | Ieki et al. | 333/194 |
| 4,316,220 | 2/1982 | Muterspaugh et al. | 358/196 |

OTHER PUBLICATIONS

"Surface Acoustic Wave Filter Manual for TV Application", published by Murata Mfg. Co., Ltd. of Japan, Cat. No. P061E.

Primary Examiner—Paul L. Gensler
Attorney, Agent, or Firm—Eugene M. Whitacre; Paul J. Rasmussen; Peter M. Emanuel

[57] ABSTRACT

The IF section of a television receiver includes an amplifier having an input terminal for receiving an IF signal and an output terminal at which an amplified version of the IF signal is developed and a SAW filter having two input terminals, one of which is connected to AC signal ground, for receiving the amplified IF signal and an output terminal for providing a modified IF signal having a bandpass characteristic determined by the SAW filter. An impedance transformation network is coupled between the output terminal of the amplifier and the input terminal of the SAW filter for increasing the effective load impedance of the amplifier and for decreasing the output impedance of the drive arrangement. The former aspect of the impedance transformation network allows a transistor with lower current supplying capabilities to be employed. The latter aspect of the impedance transformation network tends to reduce undesired voltages developed in response to reflections between the transducers of the SAW filter. Specifically, the impedance transformation network includes an inductor connected between the output terminal of the amplifier and the AC signal ground, a capacitor connected between the output terminal of the amplifier and the input terminal of the SAW filter and a resistor connected between the input terminal of the SAW filter and the AC signal ground. Desirably, the capacitance of the capacitor is in the same order of magnitude as the input capacitance of the SAW filter and the inductance of the inductor is selected to provide a resonance with the effective capacitance in the passband.

6 Claims, 2 Drawing Figures

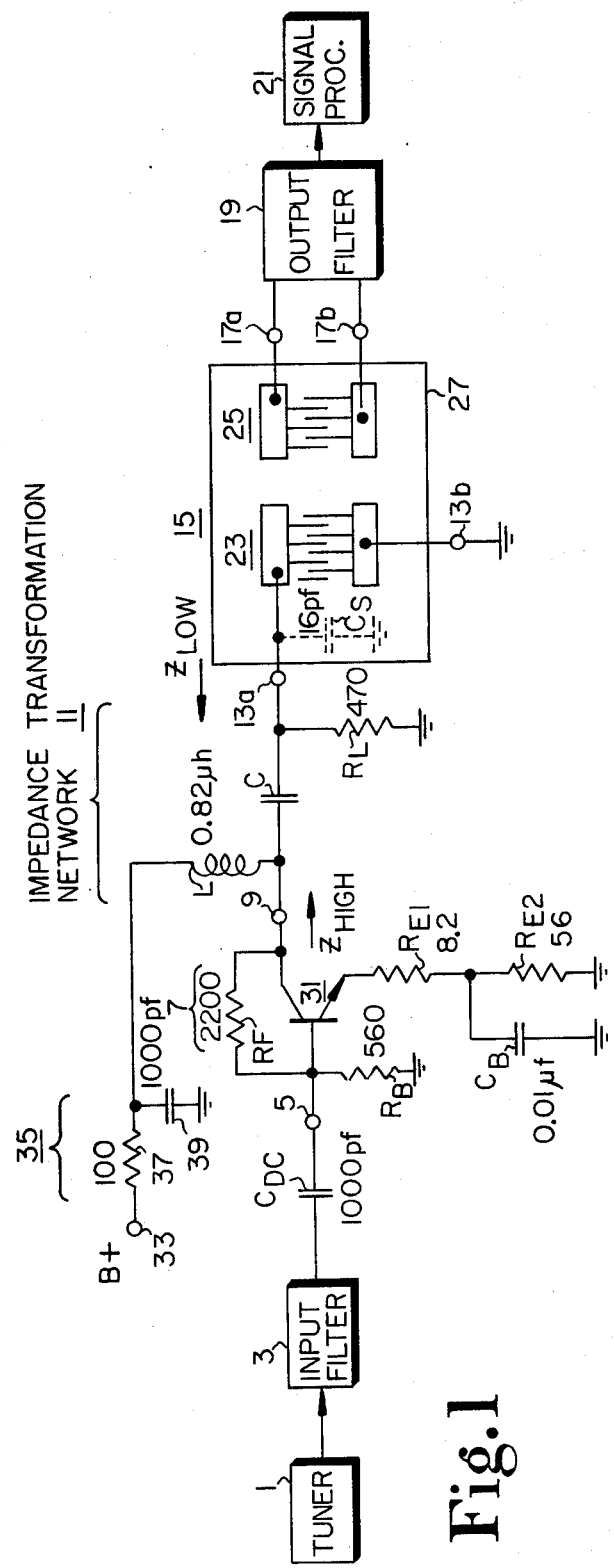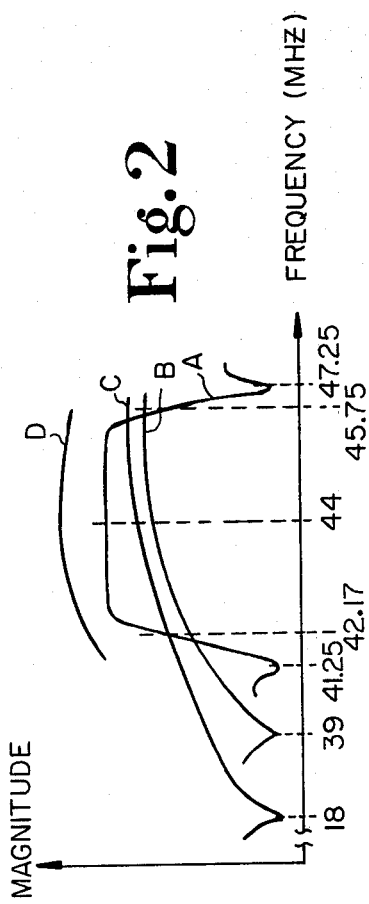

IMPEDANCE TRANSFORMATION NETWORK FOR A SAW FILTER

The present invention concerns an impedance transformation network coupled between the input of a surface acoustic wave (SAW) filter and the output of its drive amplifier.

SAW filters typically include input and output transducers formed on the surface of a substrate. Each transducer includes two comb-like electrodes having their teeth interleaved. In response to an input voltage applied to the input transducer, an acoustic wave is launched from the input transducer, propagated along the surface of the substrate and received by the output transducer which converts it to an output voltage. The frequency response of the SAW filter is determined by selecting the number, spacing between and the overlap of pairs of adjacent teeth. Because SAW filters can be constructed by integrated circuit technology, they are considerably simpler and consequentially less expensive than comparable discrete component filters. Accordingly, they have been widely employed in consumer products such as television receivers. Typically, they find application in the intermediate frequency (IF) section of the receiver for imparting a predetermined passband frequency response characteristic to the IF signal.

Although SAW filters have the above-described advantages, a portion of the surface waves launched by the input transducer may be reflected from the output transducer to produce a "double transit" wave and a portion of the double transit wave may be again reflected from the input transducer to produce a "triple transit" wave. Further reflections between the input and output transducers of higher order may also occur. Each reflected wave is converted into a corresponding voltage by the receiving transducer. In a television receiver, the delayed voltages generated by the output transducer in response to received reflected waves may appear in the video signal derived from the IF signal and thereby manifest themselves as ghosts in the image displayed by the picture tube. As each successive reflected wave is attenuated with respect to the previous one, the voltage in response to the triple transit wave is the most significant.

Many techniques for inhibiting wave reflections and reducing the amplitude of the corresponding voltages are known. The most often employed technique is by purposely increasing loss associated with the SAW filter. This can be accomplished by mismatching the impedance of the input or output circuits associated with the SAW filter with the corresponding impedances of the SAW filter. Although the amplitude of the voltages derived from the main and reflected waves are both attenuated, since the amplitudes of the voltages derived from the reflected waves are typically much lower than that corresponding to the main wave, attenuation due to the loss has a much more significant effect on reducing the visible affects of the reflected waves than on disturbing the image produced from the main wave. Typically, the attenuation of the main signal is compensated for by an amplifier preceding the SAW filter.

U.S. Pat. No. 4,271,433 entitled "SAW FILTER PREAMPLIFIER", issued June 2, 1981, in the name of G. E. Theriault, discloses a drive amplifier for a SAW filter utilized in the IF section of a television receiver. A degenerative feedback path is connected between the output and input of the amplifier to reduce its output impedance and thereby increase the attenuation of voltages derived from the double transit wave (and other higher order, evenly numbered transit waves). Specifically, this arrangement includes a transistor configured as a common emitter amplifier with a feedback resistor connected between its collector and base. An inductor is connected between the collector of the transistor and a supply voltage connection point which also serves as AC signal ground and is selected to resonate with and thereby effectively cancel the input capacitance of the SAW filter at the center frequency of the desired IF passband response, e.g., 44 MHz. A load resistor for the transistor is connected between the input of the SAW filter and AC signal ground.

The output of SAW drive amplifiers of this and similar types are typically coupled to the input of the SAW filter by a DC blocking capacitor selected large enough in value to have negligible impedance in the IF passband. Typically, for U.S. television receivers in which the center of the IF passband is at 44 MHz, the value of the DC blocking capacitor is selected at or above 1000 picofarads (pf). Ideally, such a DC blocking capacitor is not required and could theoretically be replaced by a conductor since the SAW device is capacitive. However, in practicality, a DC blocking capacitor is employed to prevent the application of DC voltages between the two comb-like electrodes of the input transducer which may otherwise produce long term failure mechanisms in the SAW device.

Accordingly, in such drive arrangements, the load resistor and the current supplying capability of the output transistor determine the voltage supplied to the input transducer of the SAW filter and the load resistor in parallel combination with the output impedance of the amplifier determined the impedance to which the double transit signal is applied and therefore the amount it is attenuated. Since typical SAW filters are voltage responsive devices, the load resistor should have a relatively large value so as not to necessitate the use of an output transistor which has exceptional current supplying capabilities and therefore expensive. In conflict with the desire to have a relatively large value load resistor for purposes of supplying desired input voltage to the SAW filter is the desire to make the value of the load resistor relatively small so as to increase the attenuation of the double transit signal.

In a SAW drive arrangement of the type described above the DC blocking capacitors do not in any significant manner affect the AC operation of the circuit. However, in accordance with the present invention, in a drive arrangement for a SAW filter, which has two input terminals for receiving an input signal, one of the input terminals being connected to an AC ground point, and two output terminals across which an output signal is developed including an amplifier having an input terminal for receiving an input signal and an output terminal at which an output signal is developed, an inductor connected between the output terminal of the amplifier and an AC ground point, a capacitor connected between the output terminal of the amplifier and the input terminal of the SAW filter and a resistor connected between the input terminal of the SAW device and an AC ground point, the value of the capacitor is selected low enough so that it has a substantial affect on the AC operation of the drive arrangement and, more specifically, in combination with the inductor and resistor forms an impedance transformation network which raises the value of the effective load impedance for the amplifier and lowers the effective output impedance of the drive arrangement. Specifically, the capacitor is desirably selected to have a value in the same order of magnitude as the input capacitance of the SAW filter and preferably less than 5 times the input capacitance. As a result, in the present drive arrangement, the capacitor substantially affects the resonance frequency of the parallel tuned circuit including the inductor and series combination of the capacitor and input capacitance of the SAW filter. (It will be noted that since the input capacitance of a typical SAW filter is less than 50 pf, if the capacitor has the value of a typical DC blocking capacitor, e.g., about 1000 pf, it will not significantly affect the parallel resonance.) In practice, the values of the capacitor and inductor are selected so that: (1) the inductor and capacitor form a series resonant circuit between the input terminal of the SAW filter and AC ground which resonates at a frequency near enough to the desired passband to attenuate double transit signals in the passband which are applied across it; and (2) the inductor, capacitor and input capacitance of the SAW filter form a parallel resonant circuit between the output terminal of the amplifier and AC signal ground which resonates at a frequency within the desired passband to increase the effective load impedance of the amplifier. The impedance transformation network makes it possible to utilize an output transistor which has comparatively less current supplying capability and is therefore less expensive and at the same time reduces the shunt impedance to which the second transit signal is applied and thereby increases its attenuation.

In accordance with a further feature of the present invention, the amplifier can be arranged to include a degenerative feedback connection between the output and input terminals of the amplifier, such as disclosed in the Theriault patent. Then, the impedance transformation network of the present invention has been found to lower the output impedance of the drive arrangement between the input terminal of the SAW filter and AC signal ground, across which the double transit signal is applied, more than would be expected solely due to the series resonant circuit including the inductor and capacitor.

The present invention will be described with reference to the accompanying Diagram in which:

FIG. 1 is partially a schematic and partially a block diagram showing an embodiment of the present invention employed in the IF section of a television receiver; and FIG. 2 includes graphic representations of various frequency response characteristics useful in facilitating an understanding of the present invention.

Typical values are shown in FIG. 1. All resistance values are in ohms unless otherwise specified and "K" stands for kilohms, "μf" stands for microfarads, "pF" stands for picofarads, and "μh" stands for microhenries.

In the television receiver shown in FIG. 1, an IF signal provided by a tuner 1 is filtered by an input filter 3. The output signal of filter 3 is coupled through a DC blocking capacitor $C_{DC}$, having a value selected so that it has negligible impedance in the IF passband, to an input terminal 5 of an amplifier 7. The output signal of amplifier 7 is developed at an output terminal 9 and coupled through an impedance transformation network 11, to an input terminal 13a of a SAW filter 15. The output signal of SAW filter 15, developed at an output terminal 17a, is coupled to IF section 19. IF section 19 detects the video, chrominance, sound and synchronization components of the IF signal which are then coupled to respective portions of a signal processing section 21.

SAW filter 15 comprises an input transducer 23 and an output transducer 25 formed on the surface of a piezoelectric substrate 27, e.g., comprising lithium tantalate ($LiTaO_3$). Each of transducers 23 and 25 includes two comb-shaped electrodes having teeth which are interleaved. One of the electrodes of input transducer 23 is connected to input terminal 13a and the other of the input electrodes of input transducer 23 is connected to input terminal 13b which is connected to AC signal ground. The two electrodes of output transducer 25 are connected to output terminals 17a and 17b. The number, spacing and amount of overlap of pairs of teeth in each of transducers 23 and 25 are selected to produce a desired bandpass characteristic suitable for shaping the frequency response of the IF passband characteristic. The F 1032U SAW device manufactured by Toshiba is suitable for use as SAW filter 15. Discrete component input filter 3 as well as discrete component filters in the IF section 21 also shape the response of the IF passband characteristic. For example, input filter 3 may include a tuned circuit for removing the sound component of the adjacent channel (commonly referred to as the adjacent channel sound signal) which occurs at 47.25 MHz. Such an input filter is described in the above-referred to Theriault patent. The bandpass frequency response characteristic imparted for receivers employed in the United States is indicated by characteristic A in FIG. 2.

Voltages developed between input terminals 13a and 13b of SAW filter 15 are converted by input transducer 23 to an acoustic wave which is propagated along the surface of substrate 27 to output transducer 25. The received wave is converted to a voltage which is developed between output terminals 17a and 17b. Unfortunately, as described above, a portion of the received wave received by transducer 25 is reflected by output transducer 25 and received by input transducer 23. This reflected wave is converted into a corresponding voltage hereinafter referred to as the double transit signal. A portion of the wave reflected from output transducer 25 and received by input transducer 23 is reflected from input transducer and received by output transducer 25 where it is converted to a voltage hereinafter referred to as the triple transit signal. Since this triple transit signal is delayed in time with reference to the main signal derived from the first transit wave propagated from input transducer 23 to output transducer 25, the triple transit signal can produce a ghost in the image produced by the picture tube of the television receiver.

Amplifier 7 includes an NPN transistor 31 configured as a common emitter amplifier. The emitter of transistor 31 is connected to signal ground resistors $R_{E1}$ and $R_{E2}$ connected in series. The base of transistor 31 is connected to input terminal 5 to receive the output signal of filter 3. A resistor $R_B$ is connected between the base and signal ground. The collector of transistor 31 is connected to output terminal 9 which in turn is connected to impedance transformation network 11. The output of amplifier 7, at the collector of transistor 31, is connected to the input of amplifier 7, at the base of transistor 31, through a resistor $R_F$.

Resistors $R_B$ and $R_F$ establish the bias voltage at the base electrode of transistor 31. Resistors $R_{E1}$ and $R_{E2}$ establish the bias voltage at the emitter electrode of transistor 31. Resistor $R_{E2}$ is bypassed to signal ground through a bypass capacitor $C_B$ chosen to have a negligible impedance in the IF passband. Resistor $R_{E1}$, which provides degenerative feedback between the base and emitter of transistor 31, is selected to control the gain of amplifier 11 to prevent it from overloading. Resistor $R_F$ provides negative feedback between the output and input of amplifier 7. This negative feedback lowers the input impedance of amplifier 7 to more closely match the impedance, e.g., in the order of 50 ohms, at the output of input filter 3. The negative feedback provided by $R_F$ also lowers the output impedance of amplifier 7 established at output terminal 9. Since the double transit signal is coupled across this output impedance, it undergoes more attenuation than that which would be provided in the absence of feedback resistor $R_F$.

Impedance transformation network 11 provides a relatively high load impedance for amplifier 7 and also provides a relatively low output impedance between input terminal 13a of SAW filter 15 and AC signal ground. As a result, the current supplying requirement of transistor 31 is lessened and the attenuation of the double transit signal is increased compared to a similar circuit without impedance transformation network 11 as will be explained below.

Impedance transformation network 11 includes an inductor L connected between output terminal 9 and a terminal 33 at which a supply voltage B+ is applied. A filter network 35 comprising a resistor 37 connected in series with inductor L and a by-pass capacitor 39 connected between the junction between inductor L and resistor 37 and AC signal ground removes AC components from supply voltage B+. The value of capacitor 39 is selected to have a relatively large value so that it has negligible impedance in the IF passband. In effect, inductor L is connected between the collector of transistor 31 and AC signal ground. The remaining portion of impedance transformation network 11 includes a capacitor C connected between output terminal 9 and input terminal 13a of SAW filter 15 and a resistor $R_L$ connected between input terminal 13a of SAW filter 15 and AC signal ground.

The circuit topology of amplifier 7, inductor L, capacitor C and resistor $R_L$ and SAW 15 is substantially the same as that shown in the above-identified Theriault patent. However, as earlier noted, in the Theriault patent, it is taught that the value of the capacitor corresponding to C should be that of a blocking capacitor with a relatively large value, e.g., at or greater than 1000 pf, so that it has a negligible impedance in the IF passband. Thus, if it were not for the practicality of preventing the application of DC voltages to SAW filter 15, according to the Theriault teaching, capacitor C could be replaced by a conductor.

In the Theriault circuit inductor L is chosen to form a parallel resonant circuit with the effective capacitance $C_S$ exhibited between the input terminal 13a of SAW filter 15 and AC signal ground which resonates substantially at the center frequency of the IF passband, e.g., at 44 Mhz in the United States. The purpose of this selection of L is to effectively cancel the effect of input capacitance $C_S$ of SAW filter 15.

In the present arrangement, capacitor C is selected to have a value at which its impedance is effective to produce a bilateral impedance transformation between output terminal 9 of amplifier 7 and input terminal 13a of SAW filter 15 in the IF passband. Specifically, the value of C is selected in the same order of magnitude as the input capacitance $C_S$ of SAW filter 15 so that it affects the resonance of the parallel resonant circuit comprising inductor L and the series combination of capacitors C and $C_S$. The particular values of C and L are selected so that (1) the parallel resonant circuit comprising L and the series combination of C and $C_S$ resonates in the IF passband and desirably at its center frequency, e.g., 44 MHz; and (2) C and inductor L form a series resonant circuit which resonates at a frequency near enough to the IF passband to reduce the output impedance between input terminal 13a and AC signal ground to which the double transit signal produced by SAW filter 15 is applied. It has been found that selecting the value of C in the order of five times or less than the value of $C_S$ produces suitable results. In terms of the resonant frequency or zero produced by the series resonant circuit, it is desirable that it be equal to or greater than $$\frac{1}{2\pi\sqrt{5LC_S}}.$$

In operation, the double transit signal produced by SAW filter 15 between input terminal 13a and AC signal ground is applied to the output impedance of the drive arrangement comprising the parallel combination of resistor $R_L$, the series tuned circuit comprising capacitor C and inductor L and the output impedance of amplifier 7 exhibited at output terminal 9 of amplifier 7. Thus, it will be appreciated that at the resonance point of the series tuned circuit comprising capacitor C and inductor L, the double transit signal will be shunted through a negligible impedance to AC signal ground. The reduction of the output impedance of the drive arrangement in the IF passband will be more pronounced the closer that the resonance (or "zero") frequency of L and C is to the IF passband as is indicated by characteristics B and C of FIG. 2. Thus, selecting the values of L and C such that a series resonance is produced at 39 MHz, just below the IF passband, will produce a significant result. However, selecting the values of L and C so that a resonance somewhat removed from the passband, e.g., at 18 MHz compared to a center frequency of 44 MHz, will surprisingly also be effective. This is due to the other aspect of impedance transformation network described below.

Impedance transformation network 11 not only decreases the output impedance presented at terminal 9 but also increases the effective load impedance of amplifier 7. Characteristic D of FIG. 2 indicates the frequency response of the load impedance. This is desirable in two respects. First, as compared with the circuit in which C is merely a DC blocking capacitor having negligible impedance in the IF passband, increasing the effective load which transistor 31 has to drive reduces the current that transistor 31 has to supply to produce the same drive voltage across SAW filter 15 and AC signal ground at a given value of $R_L$. As a result, transistor 31 can be a less expensive transistor than that employed in the drive arrangement in which C is merely a blocking capacitor.

While it might be thought that the same result can be achieved in the drive arrangement in which C merely serves as a DC blocking capacitor having a negligible impedance in the IF passband, by merely increasing the value of $R_L$ or possibly omitting it, such a selection will adversely increase the amplitude of the double transit signal. Thus, with the present arrangement a transistor capable of providing only lower powers can be selected consistent with the aim of maintaining a low triple transit amplitude.

The presence of resistor $R_L$ is also desirable since resistor $R_L$ flattens the frequency response of the effective load impedance of amplifier 7 in the IF passband because it lowers the sharpness of the resonance (or Q) of the parallel resonant circuit including L, C and $C_S$. Still further, since the input impedance of SAW devices tends to be relatively high, e.g., in the order of several thousand ohms, the absence of resistor $R_L$ could cause the effective load impedance to be so high that amplifier 7 could oscillate. In addition, resistor $R_L$ tends to reduce the effects of the variation of the input impedance of SAW filter 15.

Second, and perhaps even more striking than the effect of enabling a lower power and therefore lower cost transistor to be employed, lowering the value of C to the same order of magnitude of $C_S$ to produce impedance transformation network 11, also tends to decrease the amplitude of the double transit signal even when the zero due to the series resonance of L and C is somewhat removed from the IF passband, e.g., as described above, 18 MHz as compared to a center frequency of 44 MHz. It is believed this occurs because, as noted above, the effective load which amplifier 7 supplies is increased. This in turn increases the forward gain of amplifier 7. In accordance with a well-known feedback equation for determining the output impedance of an amplifier with feedback $$Z_{OUT}' = \frac{Z_{OUT}}{1 + \beta A},$$

where $Z_{OUT}'$ is the output impedance with feedback, $Z_{OUT}$ is the output impedance without feedback, $\beta$ is feedback factor and A is the forward gain, by increasing A, the output impedance decreases. Thus, the impedance transformation provided by network 11 increases the attenuation of the double transit signal by two mechanisms: (1) creating a series resonant circuit at input terminal 13a of SAW filter 15 having a resonance close enough to the IF passband for effectively shunting the double transit signal; and (2) increasing the forward gain of amplifier 7 and thereby decreasing its output impedance.

It is noted that the location of resistor $R_L$ is important. If $R_L$ is directly connected to output terminal 9 of amplifier 7, at the collector of transistor 31, as is suggested in the "Surface Acoustic Wave Filter Manual for TV Application" published by the MuRata Manufacturing Co., Ltd. of Japan (specifically, see pages 14 and 15) rather than at input terminal 13a of SAW filter 15, after capacitor C, any impedance transformation provided by L and C will be disturbed by $R_L$. Specifically, in the former configuration, $R_L$ will lower the effective load impedance of amplifier 7 and raise the output impedance connected between input terminal 13a of SAW filter 15 and signal ground to which the double transit signal is applied compared to the circuit according to the present teaching. The latter also occurs if $R_L$ is omitted as suggested by the Murata Manual (specifically, see pages 21 and 22).

The following table is a list of measured output impedance values for the circuit arrangement shown in FIG. 1, with the values indicated, for different values of C including 1000 pf and values in the same order of magnitude as $C_S$. In this arrangement a Toshiba F 1032U SAW filter having a $C_S$ value of approximately 16 pf was utilized.

| FREQUENCY | OUTPUT IMPEDANCE MAGNITUDE | | | |
|---|---|---|---|---|
| | C = 1000 pf | C = 82 pf | C = 68 pf | C = 56 pf |
| 40 MHz | 290 | 225 | 209 | 190 |
| 42 | 280 | 236 | 225 | 209 |
| 44 | 264 | 238 | 224 | 213 |
| 46 | 245 | 224 | 226 | 212 |
| 48 | 248 | 231 | 227 | 219 |
| 50 | 240 | 230 | 220 | 220 |

It will be noted that even at 82 pf (the closest readily available capacitor to 80 pf=5 $C_S$) which produces a series resonance with L at approximately 18 MHz, the output impedance is lower than one would except merely due to the contribution of the zero at 18 MHz. While at 44 MHz, the reduction in output impedance between 1000 pf and 82 pf is approximately 10 percent, it has been found that such a reduction can effectively reduce the amplitude of the double transit signal compared with the 1000 pf circuit.

It is of course desirable that the maximum attenuation of the double transit signal occur at the picture carrier or at least at the center of the IF passband, e.g., at 44 MHz. However, it will be noted that the resonant frequency of the series resonant circuit comprising L and C $$\left(\text{i.e., } \frac{1}{2\pi\sqrt{LC}}\right)$$

and the resonant frequency of the parallel resonant circuit comprising L and the series combination of C and $C_S$ $$\left(\text{i.e., } \frac{1}{2\pi\sqrt{L\left(\frac{CC_S}{C+C_S}\right)}}\right)$$

cannot both be at the center of the IF passband. Nevertheless, the selection of C approximately equal to 5 $C_S$ or less will reduce the double transit signal in the IF passband. This is desirable since it will at least reduce double transit signal components occurring at the frequency of the color carrier which, e.g., in the United States, occur at 42.17 MHz.

What is claimed is:

1. Apparatus comprising:
   an amplifier having an input terminal for receiving an input signal and an output terminal at which an output signal is produced;
   a surface wave device having first and second input terminals, said first input terminal being connected for receiving an input signal, said second input terminal being connected to a point of AC ground potential, and an output terminal at which an output signal is produced, said surface wave device providing a predetermined bandpass filter characteristic for filtering said input signal to produce said output signal, said surface wave device exhibiting a capacitance $C_S$ between its input terminals;

impedance transformation means coupled between said output terminal of said amplifier and said first input terminal of said surface wave device including an inductor L connected between said output terminal of said amplifier and said point of AC ground potential; and a capacitor C connected between said first input terminal of said first input terminal of said surface wave device and having a value selected so that the effective capacitance $C_E$ of the series combination of said capacitor C and said capacitance $C_S$ is substantially different from said capacitance $C_S$ and a resistance element directly connected between said first input terminal of said surface wave device and said point of AC ground potential without intervening elements having significant impedance in said passband of said surface wave device;

said effective capacitance $C_E$ and said inductor L forming a parallel resonant circuit between said output terminal of said amplifier and said point of AC ground potential having a resonant frequency within said passband.

2. The apparatus recited in claim 1 wherein said capacitance value C is in the same order of magnitude as said capacitance value $C_S$.

3. The apparatus recited in claim 2, wherein: said capacitance value C is substantially equal to or less than $5C_S$.

4. The apparatus recited in claim 1 wherein: said amplifier includes feedback means coupled between said output and input terminals of said amplifier for applying at least a portion of said output signal of said amplifier to said input terminal of said amplifier.

5. The apparatus recited in claim 4 wherein: said amplifier includes a transistor having its base electrode connected to said input terminal of said amplifier; its emitter electrode connected to said point of AC signal ground; and its collector electrode connected to said output terminal of said amplifier; and a resistor connected between said collector electrode and said base electrode.

6. The apparatus recited in claim 5 wherein:
said amplifier includes a second resistor connected between said emitter electrode and said point of AC signal ground.

* * * * *

UNITED STATES PATENT AND TRADEMARK OFFICE
CERTIFICATE OF CORRECTION

PATENT NO. : 4,410,864

DATED : October 18, 1983

INVENTOR(S) : Max W. Muterspaugh and Gary A. Whitledge

It is certified that error appears in the above-identified patent and that said Letters Patent is hereby corrected as shown below:

Column 4, line 55, after "ground" insert --through--.

Column 9, Claim 1, line 8, delete "first input" (first occurrence) and insert --output--;

Column 9, Claim 1, line 8, after "said" (second occurrence), insert --amplifier and said--.

Column 9, Claim 1, line 13, after "$C_s$" insert --;--.

Signed and Sealed this

Seventh Day of February 1984

[SEAL]

Attest:

GERALD J. MOSSINGHOFF

*Attesting Officer*  *Commissioner of Patents and Trademarks*